US008444455B2

(12) United States Patent
Schwandner et al.

(10) Patent No.: US 8,444,455 B2
(45) Date of Patent: May 21, 2013

(54) POLISHING PAD AND METHOD FOR POLISHING A SEMICONDUCTOR WAFER

(75) Inventors: Juergen Schwandner, Garching (DE); Roland Koppert, Triftern (DE)

(73) Assignee: SILTRONIC AG, Munich (DE)

( * ) Notice: Subject to any disclaimer, the term of this patent is extended or adjusted under 35 U.S.C. 154(b) by 391 days.

(21) Appl. No.: 12/774,153

(22) Filed: May 5, 2010

(65) Prior Publication Data
US 2010/0330882 A1 Dec. 30, 2010

(30) Foreign Application Priority Data

Jun. 24, 2009 (DE) .......................... 10 2009 030 297

(51) Int. Cl.
*B24B 1/00* (2006.01)
(52) U.S. Cl.
USPC .................................. 451/41; 451/57; 451/60
(58) Field of Classification Search
USPC .............. 451/36, 37, 41, 57, 59, 60; 438/459, 438/460, 690–696
See application file for complete search history.

(56) References Cited

U.S. PATENT DOCUMENTS

| | | | |
|---|---|---|---|
| 6,069,080 A | 5/2000 | James et al. | |
| 6,077,581 A | 6/2000 | Kuramochi et al. | |
| 6,214,704 B1 * | 4/2001 | Xin | 438/471 |
| 6,227,944 B1 * | 5/2001 | Xin et al. | 451/41 |
| 6,475,072 B1 | 11/2002 | Canaperi et al. | |
| 6,602,117 B1 | 8/2003 | Chopra et al. | |
| 7,160,178 B2 | 1/2007 | Gagliardi et al. | |
| 7,241,204 B2 | 7/2007 | Watanabe et al. | |
| 7,416,962 B2 * | 8/2008 | Harrison et al. | 438/459 |
| 7,582,221 B2 | 9/2009 | Netsu et al. | |
| 2001/0039119 A1 * | 11/2001 | Kishimoto | 438/690 |
| 2002/0111120 A1 | 8/2002 | Goetz | |
| 2004/0043616 A1 | 3/2004 | Harrison et al. | |
| 2005/0064709 A1 | 3/2005 | Shimomura et al. | |
| 2005/0227590 A1 | 10/2005 | Sung | |
| 2006/0258268 A1 | 11/2006 | Miyata et al. | |
| 2009/0029552 A1 | 1/2009 | Schwandner et al. | |

FOREIGN PATENT DOCUMENTS

| | | |
|---|---|---|
| DE | 10333810 A1 | 3/2004 |
| DE | 102007035266 A1 | 1/2009 |
| EP | 1651386 B1 | 4/2008 |
| JP | 08-174405 A | 7/1996 |
| JP | 10-264015 A | 10/1998 |
| JP | 2002-16025 A | 1/2002 |
| JP | 2003100670 A | 4/2003 |
| JP | 2004-71833 A | 3/2004 |
| JP | 2006-265410 A | 10/2006 |
| JP | 2007-501716 A | 2/2007 |
| JP | 2007-73796 A | 3/2007 |
| JP | 4038429 B2 | 1/2008 |
| JP | 2009-033159 A | 2/2009 |
| KR | 10-2002-0025834 | 4/2002 |
| KR | 10-0877385 A | 1/2009 |
| WO | 9213680 | 8/1992 |

OTHER PUBLICATIONS

Masahiro Kimura, Yasuo Saito, Hiroshi Daio and Kenji Yakushiji, A New Method for the Precise Measurement of Wafer Roll off of Silicon Polished Wafer, Jpn. J. Appl. Phys., vol. 38 (1999), pp. 38-39.

* cited by examiner

*Primary Examiner* — Dung Van Nguyen
(74) *Attorney, Agent, or Firm* — Brooks Kushman P.C.

(57) ABSTRACT

A semiconductor wafer is polished, wherein in a first step, the rear side of the wafer is polished by a polishing pad comprising fixedly bonded abrasives having a grain size of 0.1-1.0 μm, while supplying a polishing agent free of solid materials having a pH of at least 11.8, and, in a second step, the front side of the semiconductor wafer is polished, wherein a polishing agent having a pH of less than 11.8 is supplied. A polishing pad for use in apparatuses for polishing semiconductor wafers, has a layer containing abrasives, a layer composed of a stiff plastic and also a compliant, non-woven layer, wherein the layers are bonded to one another by means of pressure-sensitive adhesive layers.

18 Claims, No Drawings

POLISHING PAD AND METHOD FOR POLISHING A SEMICONDUCTOR WAFER

CROSS-REFERENCE TO RELATED APPLICATIONS

This application claims priority to German Patent Application No. DE 10 2009 030 297.2 filed Jun. 24, 2009 which is herein incorporated by reference.

BACKGROUND OF THE INVENTION

1. Field of the Invention

The invention relates to a polishing pad and to a method for polishing a semiconductor wafer.

2. Background Art

The semiconductor wafer to be polished is usually a silicon wafer or a substrate having layer structures derived from silicon (e.g. silicon-germanium). Said silicon wafers are used in particular for producing semiconductor components such as memory chips (DRAM), microprocessors, sensors, light emitting diodes and many more.

The requirements made of silicon wafers for fabricating memory chips and microprocessors in particular are becoming more and more stringent. This concerns firstly the crystal properties themselves (e.g. with regard to the defect densities, internal getters for trapping metallic impurities), but in particular also the geometry and the flatness of the wafer. A silicon wafer having two perfectly plane-parallel sides, excellent flatness in particular on that side of the silicon wafer on which components are to be fabricated, and low surface roughness would be desirable. It would furthermore be desirable to be able to utilize the entire area of the component side, which is currently not possible on account of a decrease in thickness at the edge of the wafer and poor geometry in the edge region.

It is known that the conventional methods for polishing semiconductor wafers are responsible for this edge roll-off These include firstly double-side polishing (DSP), which provides for simultaneously polishing both sides of a semiconductor wafer by means of a polishing pad with the supply of a polishing slurry as removal polishing, and chemical mechanical polishing (CMP), which, by contrast, comprises a final polishing only of the front side ("component side") using a softer polishing pad as so-called haze-free polishing ("finishing"). In both these polishing processes, the abrasives are supplied in the form of a polishing agent slurry.

What is relatively new in the polishing of semiconductor wafers, but has already been known and well understood for a fairly long time in the components industry, is so-called "fixed abrasive polishing" (FAP) technology, in which the semiconductor wafer is polished on a polishing pad containing an abrasive substance bonded in the polishing pad ("fixed-abrasive pad"). A polishing step in which such an FAP polishing pad is used is referred to hereinafter for short as FAP step. An essential difference from DSP and CMP is the fact that the polishing pad comprises no abrasives in DSP and CMP.

German Patent Application DE 102 007 035 266 A1 describes a method for polishing a substrate composed of silicon material, comprising two polishing steps of the FAP type, which differ in that, in one polishing step, a polishing agent slurry containing non-bonded abrasive material as a solid material is introduced between the substrate and the polishing pad, while in the second polishing step the polishing agent slurry is replaced by a polishing agent solution that is free of solid materials. As already mentioned above, however, semiconductor wafers polished in accordance with the prior art exhibit an undesirable decrease in their thickness in the edge region (edge roll-off).

The edge geometry is usually quantified by specifying one or more edge roll-off parameters which usually relate to the total thickness of a silicon wafer or to the edge geometry of its front and/or rear side and which can be used to characterize the customarily observed decrease in the thickness of the silicon wafer in its edge region or the flatness of front and/or rear side of the silicon wafer, likewise in its edge region. A method for measuring the edge roll-off of silicon wafers is described in Jpn. J. Appl. Phys. Vol. 38 (1999), pp. 38-39.

SUMMARY OF THE INVENTION

An object of the invention is to decrease edge roll-off by means of a method for polishing a semiconductor wafer, wherein, in a first step, the rear side of the semiconductor wafer is polished by means of a polishing pad comprising fixedly bonded abrasives having a grain size of 0.1-1.0 µm, and with the supply of a polishing agent which is free of solid materials and which has a pH value of at least 11.8, and, in a second step, the front side of the semiconductor wafer is polished, wherein a polishing agent having a pH value of less than 11.8 is supplied.

DETAILED DESCRIPTION OF THE PREFERRED EMBODIMENT(S)

It has surprisingly been discovered that when polishing the rear side of the semiconductor wafer using a polishing pad comprising fixedly bonded abrasives and also an abrasive-free polishing agent having a pH of greater than or equal to 11.8, the edge roll-off of the thickness of the semiconductor wafer that is observed in conventional polishing methods does not occur, rather the semiconductor wafer polished in this way even has an increase in the thickness at the edge. It has been found that the pH value of the polishing agent is a crucial criterion in this regard.

By means of a subsequent process of polishing the front side using a polishing agent that has to have a pH value of less than 11.8, an outstanding edge geometry of the semiconductor wafer can be produced irrespective of whether the polishing pad contains fixedly bonded abrasives or whether it is free of abrasives (like conventional CMP polishing pads). This is due to the fact that FAP methods using polishing agents having a pH of less than 11.8, in a similar manner to conventional CMP polishing methods (which are largely independent of the pH value of the polishing agent), tend toward producing an edge roll-off Since, however, an increase was previously produced at the edge during the polishing of the rear side, the polishing of the front side results in a compensation of these two effects. This results in a semiconductor wafer having no edge roll-off of its thickness whatsoever.

A long-standing need is thus satisfied, especially since precisely the edge roll-off and the poor geometry in the edge region of the wafer were responsible for the fact that rather than the whole wafer area, only a wafer area minus a specific edge exclusion (2-3 mm) was able to be utilized for the production of components. A huge increase in productivity can be expected as a result of this invention, since, by means of the invention, the edge exclusion is reduced practically to zero and a semiconductor wafer in which the entire wafer area can be utilized is actually made accessible for the first time.

The invention was not suggested by the prior art. Although it was known from DE 102 007 035 266 A1 to employ FAP using polishing agents in the alkaline range of pH 10-12, the method claimed therein necessarily provides two FAP polishing processes, one with and one without polishing agent containing abrasives, on one and the same side of the semiconductor wafer. The combination of an FAP polishing process on the rear side and a second FAP or CMP polishing process on the front side of the semiconductor wafer is not disclosed.

Moreover, it was not recognized in the prior art that at a pH of greater than or equal to 11.8 a selective material removal results by virtue of less material being removed in the edge region of the semiconductor wafer than e.g. in the center of the semiconductor wafer. There is also no reason to carry out investigations in this regard since those skilled in the art previously assumed that the pH value both in the case of FAP and in the case of CMP could not have such a selective effect, but rather chemically supports or amplifies the mechanical removal by the abrasives bonded in the polishing pad in the case of FAP and chemically supports or amplifies the mechanical removal by the abrasive materials contained in the polishing agent in the case of CMP, and this chemical support or amplification takes place uniformly over the entire wafer area.

The fact that this turns out to be quite different in the case of FAP and the pH value of the polishing agent allows such a selective removal is surprising. The fact that FAP technology could be suitable for practically completely eliminating the edge roll-off that otherwise always occurs in all polishing methods was by no means foreseeable. Those skilled in the art previously assumed that it is necessary to keep the material removals in any polishing methods as small as possible and to attempt, by means of concave or convex polishing of the semiconductor wafer, to restrict the edge roll-off as far as possible to the outermost edge region. Accordingly, the edge roll-off in polished wafers was accepted as given.

In subsequent epitaxy steps, attempts were made in the prior art to compensate for said edge roll-off in pretreatment steps in the epitaxy reactor. Other attempts to remove the poor geometry in the edge region by edge grinding do not constitute a suitable solution, especially since the damage produced at the edge in the process, during handling, constitutes a virtually intractable problem, that is to say that the edge grinding would in any event have to be followed by an edge polishing process. Although this would be suitable for removing the edge roll-off after DSP, an edge roll-off would be established again after a later CMP step, such that this hardly proves to be economical either.

Thus, the method of the invention constitutes the only possibility for providing a finely polished wafer (after CMP or FAP of the front side) without such an edge roll-off directly after the polishing of the front side and without any additional measures.

In the course of the production of wafers having outstanding geometrical and nanotopological properties, becoming ever more important, specifically in the context of the 22 nm design rule requirements (according to ITRS="International Technology Roadmap for Semiconductors"), and with regard to the progressive enlargement of the wafer diameter (transition from 300 nm to 450 nm), it was important to develop polishing methods that meet these requirements.

Especially for obtaining the requisite geometry, here in the context, primarily the wafer edge geometry and the nanotopology, it had already been apparent for a fairly long time that a material-removing conventional chemical mechanical polishing (CMP) would no longer be able, in terms of process engineering, to meet these requirements, in particular with regard to the edge roll-off of the semiconductor wafer and, associated therewith, the edge exclusion or the area on the semiconductor wafer that can be utilized with regard to the required geometry properties (the person skilled in the art also uses the term "fixed quality area").

The polishing process according to the invention using a polishing pad comprising fixedly bonded abrasives in the claimed range of pH values is carried out either in the context of a single-side polishing of only the rear side or in a simultaneous double-side polishing process. During the method, the pH value can be varied or can be set to a constant value, depending on the initial geometry of the semiconductor wafer to be polished. A two-stage FAP, embodied as sequential polishing of the rear and front sides, by means of a polishing pad comprising fixedly bonded abrasives, is especially preferred.

In this case, the two polishing processes, that is to say the rear side polishing and the front side polishing, can be coordinated with one another, such that targeted influencing of the wafer geometry and wafer nanotopology, especially in the wafer edge region, can be performed. For this purpose, according to the invention, the rear side has to be polished using a different pH value than the front side. Thus, by superposing the two polishing profiles (front side and rear side), in particular, a very specific resultant edge profile can be produced and the edge roll-off can ideally be reduced to zero.

The variation of the pH value is thus used according to the invention for changing the thickness profile at the outer wafer edge. By contrast, the diverse chemical mechanical polishing methods, irrespective of the way in which the method is carried out (double-side polishing, single-side polishing, removal or haze-free polishing), are carried out using a fixed pH value. Targeted influencing of the geometry in the edge region of the semiconductor wafer is thus precluded.

The method according to the invention affords advantages in particular for the polishing of semiconductor wafers of the new technology generation having a diameter of 450 mm, especially since the problems of geometry in the edge region with the use of conventional polishing methods are accentuated in the case of such large diameters. The pH-controlled polishing, as claimed in the method according to the invention, eliminates these problems.

The method according to the invention leads to an improvement in the geometry in the outer edge region of the semiconductor wafer, in particular in a range of a distance of less than or equal to 10 mm, more preferably in the range of less than or equal to 5 mm, with respect to the edge of the semiconductor wafer.

The polishing agent solution during the polishing of the rear side of the semiconductor wafer preferably comprises compounds such as sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH) or any desired mixtures thereof. The proportion of the stated compounds in the polishing agent solution is preferably 0.01 to 10% by weight, more preferably from 0.01 to 0.2% by weight. The use of potassium carbonate is especially preferred. The pH value of the polishing agent solution is at least 11.8.

The polishing agent solution can furthermore contain one or more further additives, for example surface-active additives such as wetting agents and surfactants, stabilizers acting as protective colloids, preservatives, biocides, alcohols and complexing agents.

In the method according to the invention, a polishing pad containing an abrasive material bonded in the polishing pad (FAP or FA pad) is used during the polishing of the rear side. Suitable abrasive materials comprise for example particles of oxides of the elements cerium, aluminum, silicon, zirconium and particles of hard materials such as silicon carbide, boron nitride and diamond.

Particularly suitable polishing pads have a surface topography shaped by replicated microstructures. These microstructures ("posts") have for example the form of columns having a cylindrical or polygonal cross section or the form of pyramids or truncated pyramids. More detailed descriptions of such polishing pads are contained for example in WO 92/13680 A1 and US 2005/227590 A1.

The average particle size of the abrasives contained in the FAP polishing pad is preferably 0.1-1.0 µm, particularly preferably 0.1-0.6 µm, and especially preferably 0.1-0.25 µm. The use of cerium oxide particles bonded in the polishing pad is particularly preferred, cf. also U.S. Pat. No. 6,602,117B1.

A polishing pad having a multilayered construction is particularly suitable for carrying out the method. One of the layers of the polishing pad is compliant in this case. The pad height can thus be adapted and follow continuous transitions. The compliant layer is preferably a non-woven layer. A layer composed of polyester fibers impregnated with polyurethane is particularly suitable ("non-woven").

The compliant layer preferably corresponds to the bottom-most layer of the polishing pad. Situated above it is preferably a foam layer composed of polyurethane, for example, which is fixed on the compliant layer by means of an adhesive layer. Situated above the PU foam is a layer composed of a harder, stiff material, preferably composed of a hard plastic, for which polycarbonate, for example, is suitable. Situated above this stiff layer is the layer having the microreplicated structures, that is to say the actual fixed abrasive layer. However, the compliant layer can also be situated between the foam layer and the stiff layer or directly underneath the fixed abrasive layer. The various layers are fixed to one another preferably by means of pressure-sensitive adhesive layers (PSA).

The inventor has recognized that a polishing pad without the PU foam layer that is always present in the prior art of FAP polishing pads leads to good results. In this case, the polishing pad comprises a layer having the microreplicated structures, a compliant layer and a layer composed of a stiff plastic such as polycarbonate, wherein the compliant layer can be either the middle or the bottom-most layer of the polishing pad.

These novel polishing pads are suitable in particular for use in a multi-plate polishing machine (e.g. an AMAT Reflection from Applied Materials, Inc.). This polishing machine comprises a 5 zone membrane carrier, which permits the pressure profile of the carrier to be set differently in 5 zones. In conjunction with the compliant polishing pads, this leads to outstanding results with regard to the geometry of the polished wafers.

A polishing agent containing abrasives is preferably used during the polishing of the front side of the semiconductor wafer. The proportion of the abrasive material in the polishing agent slurry is preferably 0.25 to 20% by weight, more preferably 0.25 to 1% by weight. The size distribution of the abrasive material particles is preferably monomodal in nature, and the average particle size is preferably 5 to 300 nm, more preferably 5 to 50 nm.

The abrasive material comprises a material that mechanically removes the substrate material, preferably one or more of the oxides of the elements aluminum, cerium or silicon. A polishing agent slurry containing colloidally disperse silica is particularly preferred.

The polishing agent slurry preferably contains additives such as sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH). However, the polishing agent slurry can contain one or more further additives, for example surface-active additives such as wetting agents and surfactants, stabilizers acting as protective colloids, preservatives, biocides, alcohols and complexing agents. The pH value during the polishing of the front side must be less than 11.8. The pH value preferably lies in the range of 10-11.5.

A polishing pad comprising no fixedly bonded abrasives is preferably used during the polishing process. Conventional CMP polishing pads are suitable for this purpose. The CMP polishing pads used are polishing pads having a porous matrix.

The polishing pad preferably comprises a thermoplastic or heat-curable polymer. A multiplicity of materials, e.g. polyurethanes, polycarbonate, polyamide, polyacrylate, polyester, etc., are appropriate as the material of the pad. The polishing pad preferably comprises solid, microporous polyurethane. The use of polishing pads composed of foamed plates or felt or fiber substrates which are impregnated with polymers is also preferred. Coated/impregnated polishing pads can also be configured in such a way that there is a different pore distribution and sizes in the substrate than in the coating. The polishing pads can be substantially planar or else perforated. In order to control the porosity of the polishing pad, fillers can be introduced into the polishing pad.

Commercially available polishing pads are e.g. the SPM 3100 from Rodel Inc. or the pads of the DCP-Series and also the pads with the trademarks IC1000™, Polytex™ or SUBA™ from Rohm & Hass. Instead of the polishing pads described, however, it is possible, which is likewise preferred, to use an FAP pad such as the one used during the polishing of the rear side.

In principle, the semiconductor wafers are pressed by the surface side to be polished against the polishing pad lying on a polishing plate, with the aid of a polishing head.

A polishing head also includes a retainer ring which laterally encloses the substrate and prevents it from sliding from the polishing head during polishing. In the case of modern polishing heads, that surface of the silicon wafer which is remote from the polishing pad lies on an elastic membrane that transmits the polishing pressure exerted. The membrane is part of a possibly subdivided chamber system that forms a gas or liquid cushion. However, polishing heads are also used in the case of which an elastic support ("backing pad") is used instead of a membrane.

The substrate is polished with a polishing agent being supplied between the substrate and the polishing pad and with the polishing head and the polishing plate being rotated. In this case, the polishing head can additionally also be moved translationally over the polishing pad, whereby a more comprehensive utilization of the polishing pad area is obtained.

Furthermore, the method according to the invention can equally be carried out on single-plate and multi-plate polishing machines. The use of multi-plate polishing machines having preferably two, especially preferably three, polishing plates and polishing heads is preferred.

EXAMPLE

In a first step, by means of a polishing pad comprising fixedly bonded abrasives with the supply of a polishing solution set to a specific pH value, the rear side of a silicon wafer having a diameter of 300 mm is polished in such a way that a specific thickness profile arises at the edge. The polishing pad comprises microreplicated structures in the form of truncated pyramids having particles of cerium oxide ($CeO_2$). The particle size is 0.1 to 1.0 µm.

The FAP polishing process is able, exclusively by means of an increase in the pH value of an alkaline solution, without the use of a silica sol, to convert the otherwise expected edge roll-off into an edge elevation, that is to say to produce curvatures in opposite directions as required.

As a result of the polishing of the rear side by means of an abrasive-free polishing solution having a pH value of at least 11.8, an elevation is produced in the wafer edge region and a bias is thus created which, during a subsequent process of polishing the front side of the wafer, which takes place with a pH value of 11.2, compensates for the edge roll-off that tends to be formed in this case, and a planar wafer edge region is thus formed.

In this case, the polishing of the front side can be implemented as a customary CMP step or as fixed abrasive polishing with a pH value of less than 11.8. Both polishing methods lead to the formation of a wafer edge roll-off. The method according to the invention was carried out successfully for both types of front side polishing.

It was found in the experiments that it is advantageous, for setting a desired surface roughness of the rear side of the wafer, to carry out a second partial polishing step using a suitable silica sol, such as e.g. Glanzox 3900™, which likewise takes place on the FAP polishing pad. Glanzox 3900 is the product name for a polishing agent slurry that is offered as a concentrate by Fujimi Incorporated, Japan, the concentrate having a pH of 10.5 containing approximately 9% by weight of colloidal $SiO_2$ with an average particle size of 30 to 40 nm.

Further typical conventional CMP polishing steps (soft pad+alkaline silica sol) can be added at any time as haze-free polishing processes with small removals for further reduction of the surface roughness and for reduction of the defect density (e.g. LLS="localized light scatterers"), but are not essential to the success of the invention.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method for polishing a semiconductor wafer, comprising, in a first step, polishing the rear side of the semiconductor wafer by means of a polishing pad comprising fixedly bonded abrasives having a grain size of 0.1-1.0 μm, and with supply of a polishing agent solution which is free of solid materials and which has a pH of at least 11.8, and, in a second step, the front side of the semiconductor wafer is polished, wherein a polishing agent having a pH less than 11.8 is supplied.

2. The method of claim 1, wherein the polishing agent in the first step is an aqueous solution of the compounds sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH) or any desired mixtures thereof.

3. The method of claim 2, wherein the pH of the polishing agent solution is 11.8 to 12.5 and the proportion of the compounds in the polishing agent solution is 0.01 to 10% by weight.

4. The method of claim 1, wherein the polishing agent in the second step is a polishing agent slurry containing abrasive materials and a proportion of the abrasive materials in the polishing agent slurry is 0.25 to 20% by weight.

5. The method of claim 4, wherein the proportion of the abrasives in the polishing agent slurry is 0.25 to 1% by weight.

6. The method of claim 5, wherein the average particle size of the abrasives is 5 to 300 nm.

7. The method of claim 6, wherein the average particle size of the abrasives is 5 to 50 nm.

8. The method of claim 4, wherein the abrasive substance in the polishing agent slurry comprises one or more of the oxides of the elements aluminum, cerium or silicon.

9. The method of claim 8, wherein the polishing agent slurry contains colloidally disperse silica.

10. The method of claim 9, wherein the pH value of the polishing agent slurry is in the range of 10 to 11.5.

11. The method of claim 10, wherein the pH value of the polishing agent slurry is set by means of additives selected from sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH) or any desired mixtures thereof.

12. The method of claim 1, wherein the polishing pads used in the first step contain abrasive materials selected from particles of oxides of the elements cerium, aluminum, silicon or zirconium or particles of hard materials such as silicon carbide, boron nitride or diamond.

13. The method of claim 12, wherein the average particle size of the abrasives contained in the FAP polishing pad is 0.1-0.6 μm.

14. The method of claim 12, wherein the average particle size of the abrasives contained in the FAP polishing pad is 0.1-0.25 μm.

15. The method of claim 12, wherein a polishing pad containing abrasives is used in the second step as well.

16. The method of claim 12, wherein the polishing pad containing abrasives is multilayered and comprises, alongside a layer having microreplicated structures composed of abrasive particles, a compliant, non-woven layer and a stiff plastic layer.

17. The method of claim 1, wherein the semiconductor wafer is a silicon wafer having a diameter of 300 mm or greater.

18. The method of claim 1, wherein a polishing pad containing fixedly bonded abrasives comprises a layer containing abrasives, a layer composed of a stiff plastic and also a compliant, non-woven layer, wherein the layers are bonded to one another by means of pressure-sensitive adhesive layers.

* * * * *